(12) United States Patent
Karhiniemi

(10) Patent No.: US 8,395,594 B2
(45) Date of Patent: Mar. 12, 2013

(54) TOUCH BUTTON FALSE ACTIVATION SUPPRESSION

(75) Inventor: Marko Karhiniemi, Espoo (FI)

(73) Assignee: Nokia Corporation, Espoo (FI)

( * ) Notice: Subject to any disclaimer, the term of this patent is extended or adjusted under 35 U.S.C. 154(b) by 283 days.

(21) Appl. No.: 12/997,373

(22) PCT Filed: Jun. 10, 2008

(86) PCT No.: PCT/FI2008/050342
§ 371 (c)(1),
(2), (4) Date: Dec. 10, 2010

(87) PCT Pub. No.: WO2009/150285
PCT Pub. Date: Dec. 17, 2009

(65) Prior Publication Data
US 2011/0090169 A1   Apr. 21, 2011

(51) Int. Cl.
*G06F 3/041* (2006.01)
(52) U.S. Cl. .......................................... 345/173
(58) Field of Classification Search .......... 345/173, 345/174
See application file for complete search history.

(56) References Cited

U.S. PATENT DOCUMENTS

| | | | |
|---|---|---|---|
| 6,993,607 B2 | 1/2006 | Philipp | 710/67 |
| 7,821,425 B2 * | 10/2010 | Philipp | 345/173 |
| 8,248,084 B2 * | 8/2012 | Bokma et al. | 345/173 |
| 2003/0063073 A1 | 4/2003 | Geaghan | |
| 2003/0112226 A1 | 6/2003 | Le-Pailleur | |
| 2005/0052427 A1 | 3/2005 | Wu | |
| 2008/0007434 A1 | 1/2008 | Hristov | |

FOREIGN PATENT DOCUMENTS

WO   0038042 A1   6/2000

OTHER PUBLICATIONS

International Search Report and Written Opinion received in corresponding Patent Cooperation Treaty Application No. PCT/FI2008/050342, Mar. 12, 2009, 12 pages.

* cited by examiner

*Primary Examiner* — Kevin M Nguyen
(74) *Attorney, Agent, or Firm* — Harrington & Smith

(57) ABSTRACT

A touch member (210) comprises a touch surface (20, 30) having at least two sensor electrodes (21-23) that are separated from each other on the touch surface (20, 30). Each of the sensor electrodes (21-23) have a certain signal level threshold with relation to activate/lock the touch member (210). The touch surface (20, 30) is divided into a first area and a second area each comprising at least one of the sensor electrodes (21-23). Upon touching the touch member (210) in an unlocked state, the at least two electrodes (21-23) are arranged to measure periodically a signal level received from each of the electrodes (21-23) to indicate a touch location, report periodically the touch location with respect to the first area of the touch surface (20, 30), and report the measured signal level of each of the electrodes (21-23) in the second area of the touch surface (20, 30). The controller (214) sends an instruction to select an operation state of the touch member (210) based on calculated touch location information of the reported touch location and compared signal level information of the reported measured signal level.

20 Claims, 5 Drawing Sheets

TOUCH BUTTON FALSE ACTIVATION SUPPRESSION

RELATED APPLICATION

This application was originally filed as PCT Application No. PCT/FI2008/050342 on Jun. 10, 2008, which is incorporated herein by reference in its entirety.

TECHNICAL FIELD OF THE INVENTION

This invention relates generally to method and apparatus for controlling an input member in a touch screen, and more particularly for suppressing false activation of such input member while the input member is in unlocked state.

BACKGROUND OF THE INVENTION

Touch screens and touch panels gain popularity because of their ease and versatility of operation. They are used as input devices for performing operations in electronic devices such as mobile communication terminals, media players, personal and public computers, etc. In general touch screens recognize the touch and position of the touch on the display screen and the electronic device interprets the touch and thereafter performs an action based on the touch event. Touch screens typically comprise a touch panel or touch pad that is a clear panel with a touch sensitive surface. The touch panel registers touch events and sends these signals to the controller. The controller processes these signals and provides the data to the electronic device. Typically the transparent touch screen is positioned in front of a display device of the electronic device, where the display device is configured to display a graphical user interface (GUI). The touch screen acts as an input device that is sensitive to user□s touch, allowing the user to interact with the GUI on the display.

Typically the touch panel or touch pad (small touch panel) comprises a number of touch buttons or touch keys that activate an associated function when the user touches a corresponding button or key. The touch panel has a sensing surface that acts as a touch-sensistive user interface. In capacitive technologies, the touch panel can be made of conductive or semiconductive materials or be coated with a material that stores electrical charge. Suitable materials are e.g. copper, indium tin oxide (ITO), antimony tin oxide (ATO), (semi) conductive polymers, etc. Depending on measurement arrangements, e.g. electrode charging can be used as a measurement principle. Some other measurement principles can also be applied, e.g. sending and receiving electrodes, where a finger is an interfering object between the electrodes.

For example, when the panel is touched, a small amount of charge is drawn to the point of contact and the charge is measured in electric circuits of the touch panel before sending the information the controller. In the activated state the sensing surface detects, for example, a change of capacitance when the user touches it by a finger or other object. This change is detected by a sensor, e.g. capacitive sensor, or sensors associated to each button and the sensor provides an output signal responsive to a degree of capacitive coupling between the touch of the finger or object and the button. The output signal relates typically to the detected signal strength associated with the button. The function associated to the button is activated if the detected output signal of the button is in excess of a predetermined signal strength threshold, i.e. that the button is interpreted to be touched.

Electronic devices comprising the touch panel or touch buttons are rather unshielded from accidental activations of the touch buttons, particularly if the touch buttons are in unlocked operation state. For example, when answering a mobile phone a finger or cheek of the user may accidentally touch or sweep the touch buttons and hence activate the touch buttons improper way to cause false inputs. This happens when the touch of the user causes the sensor of the touch button to measure a signal strength that reaches the preset signal strength threshold level and consequently triggers the button.

FIGS. 1a-1d show sensor electrode structures of different touch buttons that are used in the prior art solutions. FIG. 1a depicts a single uniform sensor (11) that forms a touch surface 15a of the touch button. Here, the touch is triggered when it cause the signal strength to exceed signal strength threshold level. This kind of touch button does not have any accidental activation prevention.

FIG. 1b shows a touch pad comprising the touch surface 15b where each of the touch buttons comprises a single uniform sensor 12, 13, 14, 16. Here, if upon touching the touch pad two or more sensors 12, 13, 14, 16 are activated with enough strong signal strength level at the same time then the touch is discarded. Document U.S. Pat. No. 6,993,607 discloses a basic method for accidental activation prevention shown in FIG. 1b. If the user□s finger overlaps several touch buttons at the same time by repeatedly measuring a detected signal strength associated with each button and defining which of the several touch buttons have a maximum signal strength compared to others. If the touch button of the maximum signal strength is found then there is interpreted that only this button is pressed and the others of the several buttons are discarded. Therefore, the document teaches how to prevent accidental false inputs from buttons adjacent to a selected button. However, U.S. Pat. No. 6,993,607 does not teach how to prevent accidental activation of a single touch button.

FIGS. 1c-1d depict the prior art solutions in which it is possible to prevent accidental activation of the single touch button to some extent. The functionality of the single touch button can be divided into multiple sensor electrodes. FIG. 1c shows a touch surface 15c of a ring shaped electrode that is divided into three sensor sectors 17a-17c. FIG. 1d shows a touch surface 15d of a single button in which a sensor associated to the functionality of the single button is composed of four adjacent separated sensor electrodes 18a-18d. When the user□s finger touches the touch button it is activated only if measured signal strength of each of the sensor electrodes 17a-17c, 18a-18d is simultaneously in excess of the threshold level preset to each of the sensor electrodes 17a-17c, 18a-18d. However, this does not guarantee that the user does not activate the touch button when firmly touching or sweeping the button accidentally. For example a call/hang-up button of the mobile phone can be implemented using prior art touch button structures. Then during a phone call the user□s cheek may cause an unwanted hangup of a call in the mobile phone if the cheek accidentally activates all the sensor electrodes of the call/hang-up button simultaneously. This may be bothersome for the user.

SUMMARY OF THE INVENTION

In accordance with a first aspect of the invention there is provided a novel touch member. The touch member comprises:
a touch surface having at least two electrodes that are separated from each other on the touch surface, each of the electrodes having a certain signal level threshold with relation to activate the touch member, and a first area and a second area within the touch surface, wherein the at least two electrodes, upon touching the touch member in an unlocked state, are arranged to measure periodically a signal level received from each of the electrodes to indicate a touch location, report periodically the touch location with respect to the first area of the touch surface, report the measured signal level of each of the electrodes in the second area of the touch surface, and receiving instruction to select an operation state of the touch member based on calculated touch location information of the reported touch location and compared signal level information of the reported measured signal level.

A user of the electronic device is enabled to suppress false activation of the electronic device by using a touch member which monitors both the touch location on the touch surface as well as the signal level of the electrodes. Therefore, the user of the electronic device comprising such a touch member cannot accidentally activate false operation state when the touch member is in unlocked state.

In accordance with a second aspect of the invention there is provided a novel electronic device. The electronic device comprises:

at least one touch member having a touch surface comprising at least two electrodes that are separated from each other on the touch surface, each of the electrodes having a certain signal level threshold with relation to activate the touch member, and having a first area and a second area within the touch surface, the at least two electrodes, upon touching the touch member in an unlocked state, are arranged to measure periodically a signal level received from each of the electrodes to indicate a touch location, report periodically the touch location with respect to the first area of the touch surface, and report the measured signal level of each of the electrodes in the second area of the touch surface, a controller arranged to calculate a change of the touch location based on the reported touch location to produce location information, compare the reported measured signal level to the signal level threshold of the corresponding electrode to produce signal level information, select an operation state of the touch member based on received location information and signal level information.

The electronic device can be, e.g. a mobile communication terminal, a palmtop computer, a portable play station, a portable media station, or a combination of them.

In accordance with a third aspect of the invention there is provided a novel method that can be used for suppressing false activation of an electronic device. The method comprises:

defining a certain signal level threshold to each of at least two electrodes separated from each other on a touch surface, the signal level threshold relating to activate the electrode, upon touching the touch surface, measuring a signal level from each of the at least two electrodes to indicate a touch location on the touch surface, reporting periodically the touch location with respect to a first area of the touch surface, reporting the measured signal level of each of the electrodes in a second area of the touch surface that excludes the first area, calculating a change of the touch location based on the reported touch location to produce location information, comparing the reported measured signal level to the signal level threshold of the corresponding electrode to produce signal level information, and selecting an operation state of a touch member based on location information and signal level information.

Various embodiments of the invention together with additional advantages will be best understood from the following description of specific embodiments when read in connection with the accompanying drawings.

The embodiments of the invention presented in this document are not to be interpreted to pose limitations to the applicability of the appended claims. The verb "comprise" or any other variation thereof is used in this document as an open limitation that does not exclude the existence of also unrecited features. The features recited in depending claims are mutually freely combinable unless otherwise explicitly stated. The terms "a," "an," and "at least one," as used herein, are defined as one or more than one. The term "plurality," as_used herein, is defined as two or more than two. The terms "including" and "having," as used herein, are defined as comprising. The term "another." as used herein, is defined as at least a second or more. The terms "program," "computer program," and "computer instructions," as used herein, are defined as a sequence of instructions designed for execution on a computer system.

BRIEF DESCRIPTION OF THE DRAWINGS

Embodiments will be described in detail below, by way of examples only, with reference to the accompanying drawings, of which

DETAILED DESCRIPTION OF THE INVENTION

Figure 1A:
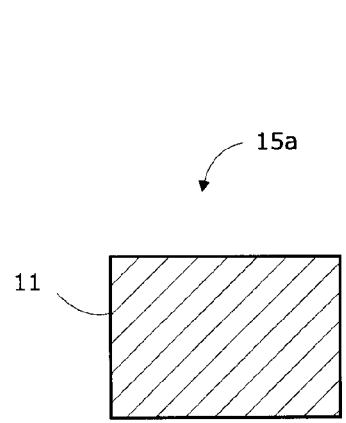
FIGS. 1a-1d depict touch buttons comprising touch surfaces of different constellations of sensor electrodes according to the prior art.
Figure 1B:
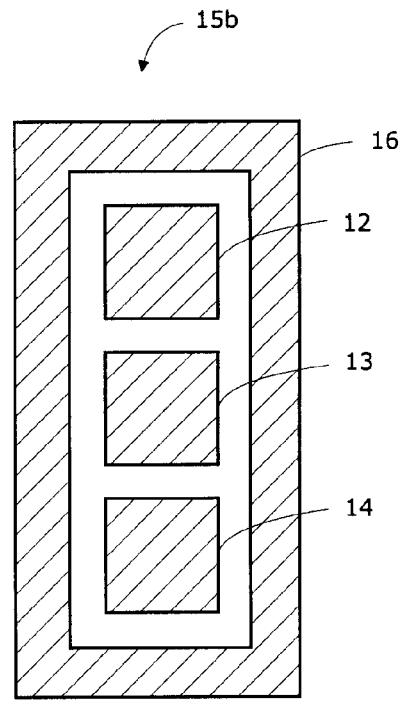
Figure 1C:
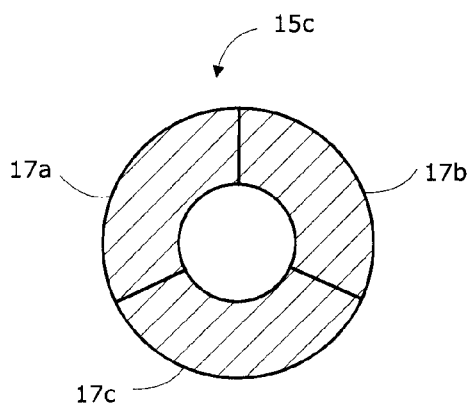
Figure 1D:
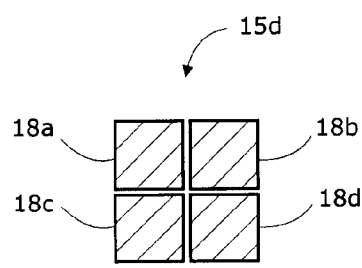
Figure 2:
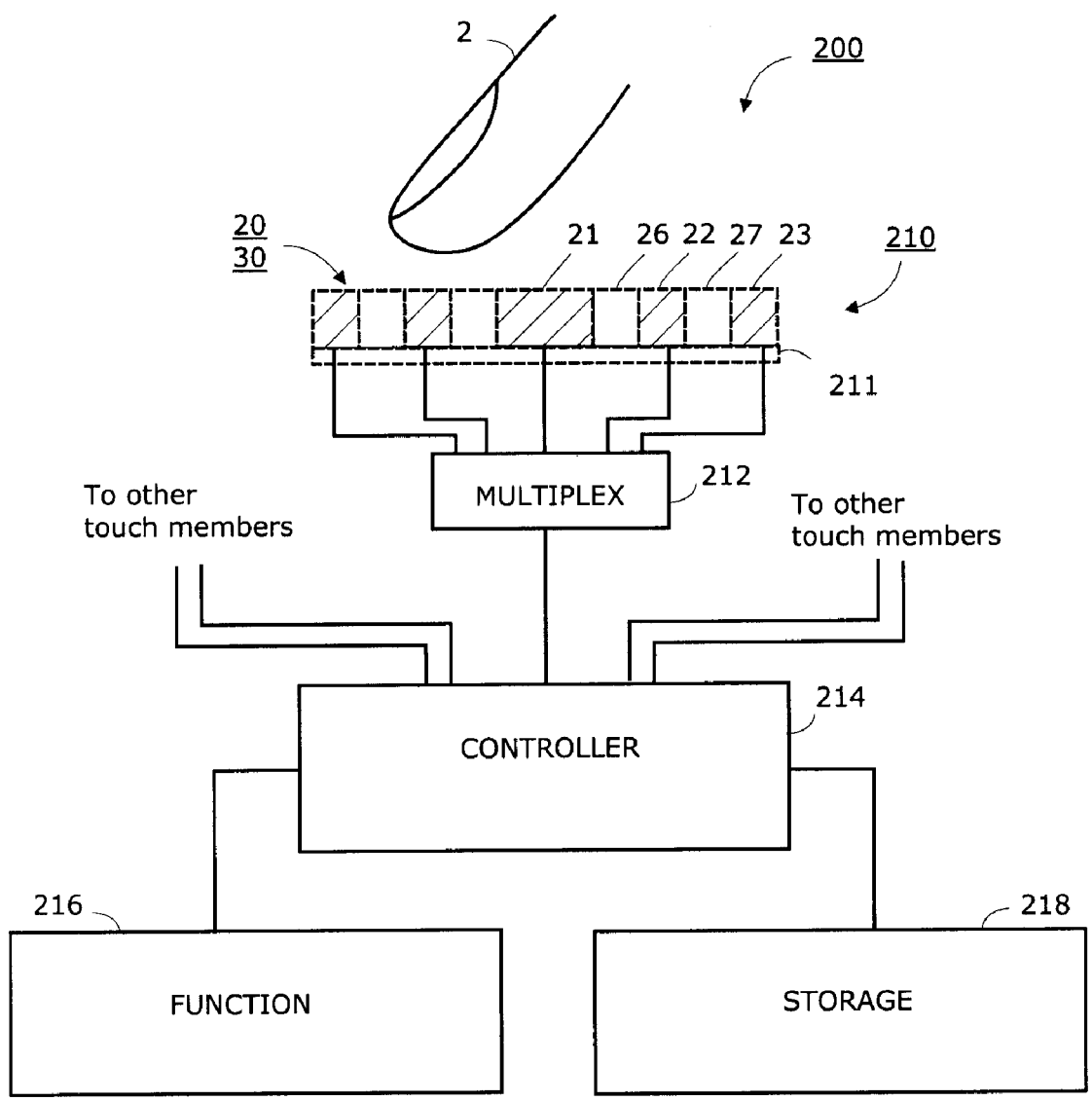
FIG. 2 depicts a block diagram of an electronic device according to an embodiment.

FIG. 2 depicts an exemplary block diagram of an embodiment of the electronic device 200. The electronic device 200 comprises at least one touch member 210 according to an embodiment. A side projection of the touch member 210 is shown in FIG. 2. The touch member 210 comprises at least two sensor electrodes 21-23 separated with spacings 26, 27 from each other and placed on a substrate 211. The touch member 210 comprises a touch surface 20, 30 that is touched by the user, preferably by a finger 2, to activate/deactivate desired function of the electronic device 200. When the finger 2 touches the sensor electrodes 21-23, the sensor electrodes 21-23 sense certain property of the finger 2 and produce a relative sensor signal. This property can be e.g. capacitance, resistance, heat or other such property that can be measured by touch-sensitive sensors. The electronic device 200 comprises a controller block 214 that receives sensor signals from the sensor electrodes 21-23 to control and process them further. The sensor signals from the touch member 210 and as well as from other possible touch members of the electronic device 200 are connected to the controller block 214. Optionally, the electronic device 200 comprises a multiplexer 212 and the sensor signals from the touch member 210 and as well as from other possible touch members of the electronic device 200 are connected to the controller block 214 through the multiplexer 212 that is arranged to multiplex conductors from each of the electrodes so that an average number of input/output conductors from the touch member is less than a number of the electrodes in the touch member 210. As exemplary shown in FIG. 2, when the sensor signals from the sensor electrodes 21-23 are multiplexed a number of connections from the touch member 210 can be reduced and an average of two connections per each touch member 210 to the controller block 214 can be achieved. Any of the signal connections between the sensor electrodes 21-23, the optional multiplexer 212 and the controller block 214 can be made by using either wired or wireless connections. The controller block 214 comprises a micro-controller unit (MCU) or an application specific integrated circuit (ASIC) that works with firmware to monitor the sensor signals from the sensor electrodes 21-23 and to process the monitored sensor signals and to send the processed information further to function blocks 216 of the electronic device 200. Alternatively, the controller block 214 comprising the MCU or ASIC, e.g. mounted on a circuit board, is integrated to the substrate 211 of the touch member 210, and is arranged to monitor the sensor signals from the sensor electrodes 21-23 and to process the monitored sensor signals and to send the processed information further to control function blocks 216 of the electronic device 200. The processed information can be also sent to function blocks 216 via a main processor unit (not shown) of the electronic device 200. The electronic device 200 further comprises a storage block 218 that is operatively connected to the controller block 214. The storage block 218 generally provides a place to hold data that is being used by the controller block 214 and the electronic device 200. The storage block 218 may communicate with an external database, e.g. Internet database or other remote database.

Figure 3:
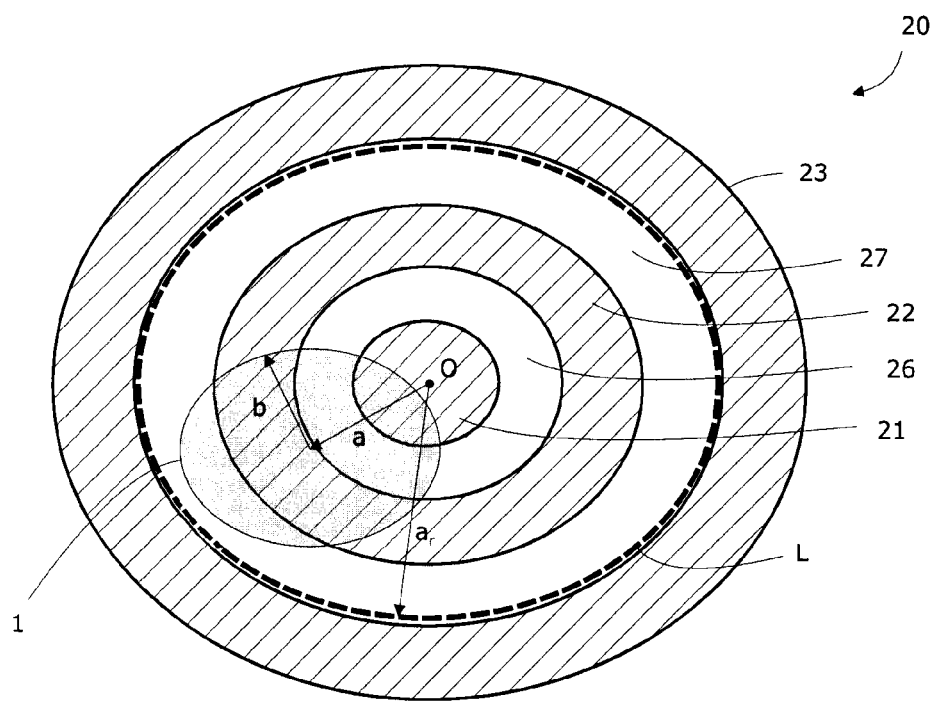
FIG. 3 depicts a touch member comprising a touch surface with sensor electrodes according to an embodiment.
Figure 4:
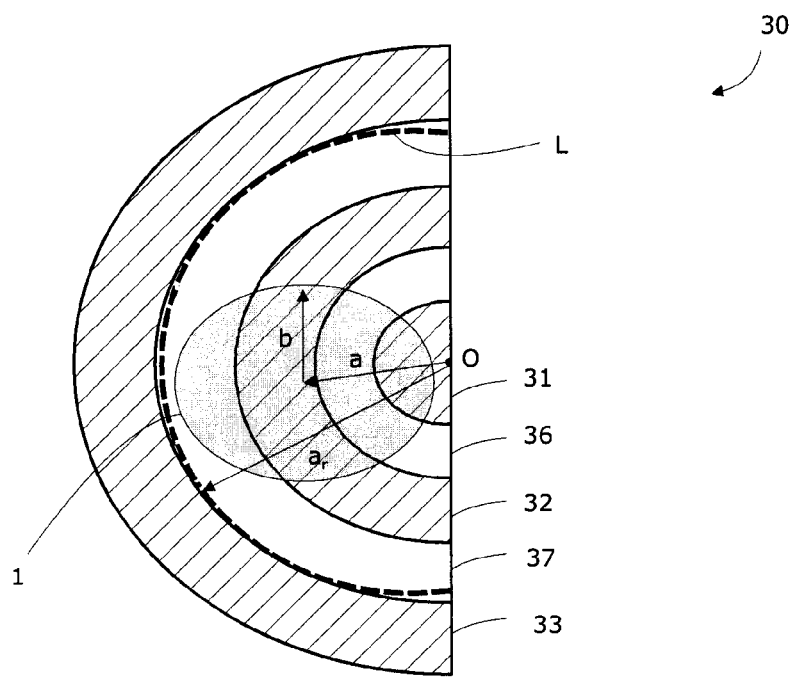
FIG. 4 depicts a touch member comprising a touch surface with sensor electrodes according to another embodiment.

FIG. 3 depicts a touch surface 20 of a touch member 210 according to an embodiment. The touch surface 20 comprises sensor electrodes 21-23 that are separated from each other with spacings 26, 27. As exemplary shown, the sensor electrodes 21-23 are depicted to have a ring shape and they are configured to form a concentric constellation. Although a number of sensor electrodes 21-23 depicted is three, any other number of electrodes 21-23 can be used; depending on the implementation preferably e.g. 2-5 electrodes can be used. Although a ring shape of sensor electrodes 21-23 are depicted, any other shape of electrodes 21-23 can be used; depending on the implementation e.g. circles, ovals, squares, triangles, polygons, and the like shapes of electrodes can be used. A form factor of the sensor electrode 21-23, as well as the spacing 26, 27 can either be a full ring shape or, alternatively, a half ring shape of above mentioned positional shapes. As shown in FIG. 4 a touch surface 30 comprises sensor electrodes 31-33 and spacings 36, 37 having a for factor of a half of the ring shape (half moon). The size and shape of sensor electrodes 21-23, 31-33 may vary according to specific needs of the electronic device 200 comprising one or more such touch members 210 as an input device. E.g. a half ring shape of sensor electrodes 31-33 are usable at the edge of the covers on the side of the mobile phones, sliding-type handsets or other such electronic devices. However, the sensor electrodes 21-23, 31-33 and associated spacings 26, 27, 36, 37 should be designed to have at least a size that a finger touch 1, as shown shaded on the touch surface 20, 30 in FIGS. 2 and 3, shall overlap an area of two sensor electrodes 21-23, 31-33. Therefore, the diameter of the touch surface 20, 30 should be preferably in a range of 10-20 mm. However, the diameter can be less than 10 mm and more than 20 mm depending on the application.

In a touch member 210 according to an embodiment the touch surface 20, 30 comprising at least two sensor electrodes 21-23, there is determined for each of the sensor electrodes 21-23 a certain signal level threshold that has to be reached as a response to the touch 1 in order to establish the corresponding sensor electrode i.e. in order to activate the corresponding sensor electrode. If as a response to the touch 1 the signal level threshold determined for the corresponding sensor electrode 21-23 is not reached then this sensor electrode is not established. It depends on the predefined conditions that are set for the signal level threshold whether the threshold is considered to be reached or not to be reached. The threshold levels can be set multiple ways: e.g. they can be single fixed threshold limits, lower and higher threshold limits, dynamic threshold limits for a single electrode, or a combination of single fixed threshold limits, lower and higher threshold limits, dynamic threshold limits for adjacent electrodes, etc. In the latter case a set of appropriate threshold bands would be needed. The signal level threshold is reached when a preset condition for the threshold is fulfilled and the signal level threshold is not reached when a preset condition for the threshold is not fulfilled. The threshold could be considered to be reached, for example, in case the signal level threshold is exceeded or gone under or equaled or remained within the band, then the corresponding sensor electrode can be either established or not established depending on conditions that are predefined for the thresholds. When the sensor electrode 21-23 is established means here that the sensor electrode will be in active operation mode i.e. it will sense the touch 1 properly. At least two of the sensor electrodes 21-23 has to be established in order to activate the touch member 210. For example, the touch 1 shown in FIGS. 3 and 4 is recognized when both of two the sensor electrodes 21, 22 are established at the same time. If the finger touch 1 overlaps only one of the sensor electrodes 21-23, 31-33 the touch 1 is not recognized even then the corresponding sensor electrode was established.

In a touch member 210 according to an embodiment the sensor electrodes 21-23, 31-33 are configured to preferably form a concentric constellation as exemplary shown in FIGS. 3 and 4. The location of a reference point O on the touch surface 20, 30 is determined and it preferably is a certain main point with respect the constellation of the sensor electrodes 21-23, 31-33. The reference point is preferably a center point of the constellation, e.g. the center point 0 of the ring electrode 21 as shown in FIG. 3. Coordinates of the center point 0 are predetermined according to the shape of the sensor electrodes 21-23, 31-33 and the shape of the touch surface 20, 30. The electric properties to be measured by the sensor electrodes 21-23, 31-33 may be constant or vary within each of the sensor electrodes. For example, capacitance sensors can be used to sense the touch 1 on the touch surface 20, 30. For example, a mutual capacitance between two electrodes can be measured or, alternatively, capacitance of each of the sensor electrodes 21-23, 31-33 can be measured relative to ground.

In a touch member 210 according to an embodiment the touch 1 is recognized if two of the adjacent sensor electrodes 21-23 of a plurality of the sensor electrodes 21-23 sense the touch 1 at the same time. This means that both the adjacent sensor electrodes 21-23 have be established at the same time as explained earlier. As shown exemplary in FIG. 3 the touch 1 covers the shaded area on the touch surface 20 and overlaps two sensor electrodes 21, 22. The touch 1 provides a certain change of electric properties of the two sensor electrodes 21, 22. Both of sensor electrodes 21, 22 have measured their instant electric property values, i.e. sensor signals, which depend on the areas that the touch 1 covers in both of the two electrodes 21, 22. Depending on the location of the touch 1 on the touch surface 20 different sensor signals are measured on both two sensor electrodes 21, 22. Alternatively, depending on the location of the touch 1 on the touch surface 20 different sensor signals are measured that correspond to the mutual electric properties between two sensor electrodes 21, 22. Therefore, the location of the touch 1 and more precisely contours of finger touch 1, i.e. an approximate size of the touch 1, can be outlined from information about the measured instant sensor signals. A movement of the location and contours of the touch 1 can be outlined if information about measured sensor signals changes between successive measurements. In a summary, upon touching the touch member 20, 30 in an unlocked state, the sensor electrodes 21-23, 31-33 are arranged to measure periodically sensor signal of each of the sensor electrodes 21-23, 31-33 either individually or mutually in order to indicate the location of the touch and the contours of the touch on the touch surface 20, 30.

In a touch member 210 according to an embodiment the touch surface 20, 30 is divided into to areas so that if the touch 1 is within a first area it activates the functionality associated to the touch member 210 and if the touch 1 is within a second area the functionality associated to the touch member 210 is discarded. As exemplary shown in FIGS. 3 and 4 a borderline L depicts the division into the first and second area of the touch surface 20, 30. Preferably, the borderline L follows the shape of the sensor electrodes 21-23, 31-33. The borderline L is a logical line and its distance $a_r$ from the reference point O as well as its width is adjustable. According to these example, the sensor electrodes 21, 31 and 22, 32 belong to the first area and the sensor electrode 23, 33 to the second area. Preferably, the outer electrode 23, 33 belongs to the second area which means that upon touching the outer sensor electrode 23, 33 all touches sensed on the touch surface 20, 30 are discarded. The sensor electrodes 21-23, 31-33 are arranged to report periodically the location of the touch 1 (and the contours of the touch 1) with respect to the first area of the touch surface 20, 30 based on sensor signal measurements as earlier described. Preferably, the location of the touch 1 is reported with respect to the reference point O that is also the reference point of the first area and the second area, too. According to some embodiments, it is more important to know whether the touch 1 is within the first area rather than the exact location of the touch 1 in the first area.

In a touch member 210 according to an embodiment the location of the touch on the touch surface 20, 30 is reported with respect to the reference point O of the first area. The contours of the touch 1 and the location of the touch 1 are reported from the sensor electrodes 21-23, 31-33 by reporting a distance $a_n$ (where n is a number of periodical measurements) between the frequency point O of the touch surface 20, 30 and an approximate center point of the contours of the touch 1. The contours of the touch 1 and the location of the touch 1 are reported from the sensor electrodes 21-23, 31-33 by further reporting a relative size of the touch 1 based on measurements of sensor signals as described earlier. Because the contours of the finger touch 1 is approximately seen as a circular figure the relative size of the touch 1 can be considered to depend on a radius of the touch 1 to which in the following is referred by $b_n$ (where n is a number of periodical measurements). As a conclusion, the location of the touch 1 or coordinates for the touch 1 are reported as a function of ($a_n$, $b_n$), where ($a_1$, $b_1$) represents coordinates for a first touch that is measured by the sensor electrodes 21-23, 31-33, i.e. a starting point for a series of touches, and where ($a_n$, $b_n$) represents coordinates for a last touch that is measured by the sensor electrodes 21-23, 31-33, i.e. a stopping point for a series of touches. According to an embodiment of the touch member 210, the series of touches ($a_n$, $b_n$) is continuous so that the touch 1 is present on the touch surface 20, 30 all the time of the sweep. The function of ($a_n$, $b_n$) represents a direction of the movement or sweep, too.

In an electronic device 200 according to an embodiment the controller block 214 is arranged to calculate a function of ($a_n$, $b_n$) based on reported periodical measurement received from the sensor electrodes 21-23, 31-33. The controller block 214 calculates the movement of the series of the locations of the touches, from the starting point to the stopping point of the sweep of the touch. The controller block 214 also compares the first coordinate $a_n$ of the coordinates ($a_n$, $b_n$) with the distance $a_r$ of the borderline L so that movement of the touch 1 between the first and the second area of the touch surface 20, 30 is monitored.

In an electronic device 200 according to an embodiment the controller block 214 is arranged to calculate an average of the touch i.e. a series of touches having coordinates ($a_n$, $b_n$).

In a touch member 210 according to an embodiment the sensor electrodes 23, 33 residing in the second area report their measured sensor signals. If any of the coordinates ($a_n$, $b_n$) reveal that the touch 1 overlaps any of the sensor electrodes 23, 33 in the second area, e.g. monitoring reveals that the coordinate $a_n$ is equal to or more than the distance $a_r$ of the borderline L, all the previous touches of the series of touches are discarded.

In a touch member 210 according to an embodiment if any of the coordinates ($a_n$, $b_n$) reveal that the touch 1 overlaps all the sensor electrodes 23, 33 in the second area at the same time as the touch 1 overlaps all sensor electrodes 21-22, 31-32 in the first area, then all the previous touches of the series of touches are discarded. This means that if all the sensor electrodes 21-23, 31-33 are touched simultaneously, the touch member 210 will become to locked operation mode, i.e. the touch member 210 is not able to input any information. This kind of false touch suppression is useful, for example, in preventing the cheek or other flat object to accidentally hang-up the call when answering to the mobile phone. This mechanism is the most useful in touch buttons associated to critical operations, such as a cancel button, call/hang-up button, zoom/slider button and other robust operation related buttons.

In an electronic device 200 according to an embodiment the controller block 214 is arranged to select an operation state of the touch member 210 based on received reported locations of the touch 1, i.e. calculated function of ($a_n$, $b_n$), and based on comparison of reported measured signal levels of the sensor electrodes 23, 33 in the second area on the touch surface 20, 30 with respect their signal level thresholds. The controller block 214 sends a selection instruction to the sensor electrodes 21-23, 31-33 of the touch member 210. The operation state can be selected to be an activated operation state or deactivated operation state. When the activated operation state is selected for the touch member 210 it performs the functionality associated to it, e.g. call, hang-up, cancel, etc. When the deactivated operation state is selected for the touch member 210 it will be in a locking state which means that the touch of the touch member 210 is suppressed or discarded. In this application an unlocked state of the touch member 210 refers to the activated operation state, i.e. the touch member 210 is switch on and it is ready to receive input data to perform the functionality associated to this particular touch member 210.

Figure 5A:
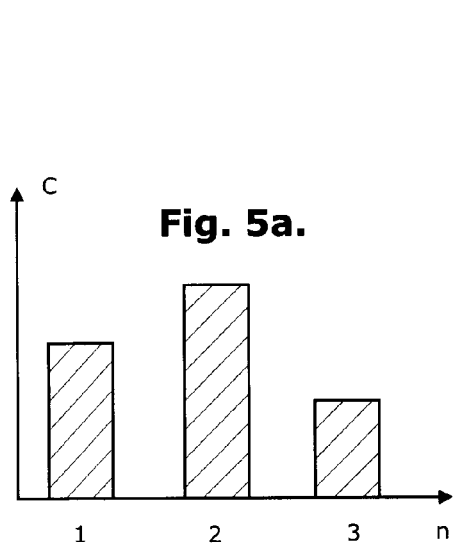
FIGS. 5a-5c depict examples of signal distribution graphs according to some embodiments.

In a touch member 210 according to an embodiment the sensor electrodes 21-23, 31-33 are arranged to receive an instruction to select an operation state of the touch member 210. This information is sent from the controller block 214 of the electronic device 200 or alternatively from the controller block 214 being integrated to the touch member 210. In a touch member 210 according to an embodiment the sensor electrodes 21-23, 31-33 are modified so that, upon touching the touch surface 20, 30, a projected signal level measured from the sensor electrodes 21-23, 31-33 draws appropriate signal level graph distribution that is predetermined. A signal level threshold for each of the sensor electrodes 21-23, 31-33 is defined and FIG. 5a depicts an exemplary graph distribution of signal level thresholds for each of the sensor elements 21-23, 31-33. These signals levels (signal strengths) are presented for example in capacitances C. A graph for each sensor electrode is expressed in number 1, 2, 3, where n denotes a total number of sensor electrodes in a particular touch member 210. FIG. 5a thus depicts an example of an appropriate signal level distribution graph in which signal level thresholds for each sensor electrodes are expressed in a form of successive graphs having a certain predetermined order. For example, the sensor electrode n=1 may relate to the innermost sensor electrodes 21, 31 of FIGS. 3 and 4, correspondingly n=2 relates to the adjacent sensor electrodes 22, 32, and correspondingly n=3 relates to the outermost sensor electrodes 23, 33 of FIGS. 3 and 4. When predefining the appropriate signal level distribution graph for the sensor electrodes 21-23, 31-33 of the touch member 210, it is possible to take into account a size of the touch 1 (i.e. the location and the contours of the touch 1), a movement of the touch 1, a duration of the movement of the touch 1 and the direction of the movement of the touch 1 so that the sensor electrodes 21-23, 31-33 can measure and report instant signal levels based on the appropriate signal level distribution graph that was predefined. In this case measured and reported signal levels are called projected signal levels. For example, if, upon touching the touch surface 20, 30, mutual capacitances between two adjacent sensor electrodes 21-23, 31-33 or individual capacitances in each of two sensor electrodes 21-23, 31-33 are measured (and in the latter case also compared) as a result of these measurements exists projected capacitances. Then based on the projected capacitances the size (contours) and location of the touch 1 is discovered and the location and size information is reported with respect to the first area, i.e. by means of coordinates ($a_n$, $b_n$) as earlier explained. A series of the touches 1, i.e. a continuous sweep of the touches 1 on the touch surface 20, 30, is then presented as a function of ($a_n$, $b_n$), where ($a_1$, $b_1$) defines the first touch location and ($a_n$, $b_n$) defines the last touch location of the sweep. Further the direction R of the sweep can be built-in the appropriate signal level distribution graph.

Figure 5B:
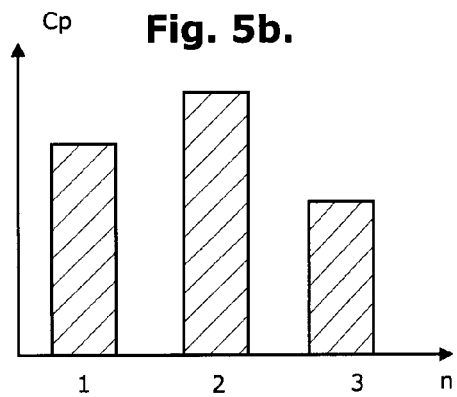
Figure 5C:
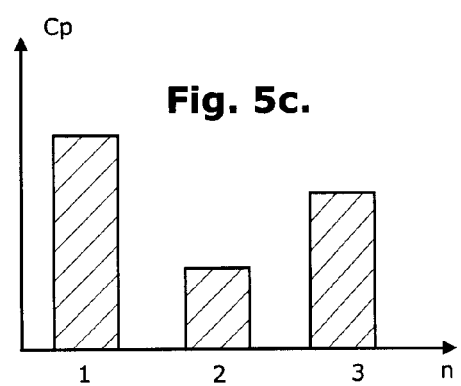

FIGS. 5a-5c show an exemplary embodiment of how upon touching the touch surface 20, 30, the electronic device 200 comprising the controller block 214 calculates a change of projected signal level measured from each of the sensor electrodes 21-23, 31-33 with respect to the appropriate signal level graph distribution that is predetermined and stored in the storage block 218. As an example, capacitance C is used as an electronic property to be detected in this case. FIG. 5a depicts the appropriate capacitance graph distribution for the sensor electrodes 21-23, 31-33 upon touching them. FIG. 5b depicts measured projected capacitances from the sensor electrodes 21-23, 31-33. A change between the appropriate capacitance and the projected capacitance graph distribution is seen. A change in the projected capacitances is here an increase in the projected capacitances and this occurs for all the sensor electrodes n=1-3 correspondingly. The increase in the projected capacitances corresponds to changes in the size (contours) of the touch 1 and consequently changes in the location of the touch 1. Here as well, the location and size information is reported with respect to the first area, i.e. by means of coordinates ($a_n$, $b_n$) as earlier explained. However, because all the sensor electrodes n=1-3 are detected at the same time, the touch 1 is discarded. FIG. 5c as well depicts measured projected capacitances from the sensor electrodes 21-23, 31-33. A change between the appropriate capacitance graph distribution of FIG. 5a and the projected capacitance graph distribution of FIG. 5c is seen. A change in the projected capacitances is here an increase in the projected capacitances and this occurs for two of the sensor electrodes n=1, 3. However, a change in the projected capacitances for one of the sensor electrodes n=2 is a decrease and the value of its projected capacitance is below the capacitance level threshold, and, therefore, the touch 1 is discarded. In addition, an increase in the projected capacitance of the sensor electrode n=3 is detected, and, therefore, the touch 1 or a series of touches is discarded.

In an electronic device 200 according to an embodiment the controller block 214 is arranged to discard the touch 1 or a series of the touches if based on reported measured signal levels from those the sensor electrodes 23, 33 that reside on the second area of touch surface 20, 30 reveals after comparison to the signal level threshold that the touch 1 or any of the touches in a series of the touches are in the range of the appropriate predefined signal level threshold band.

Figure 6:
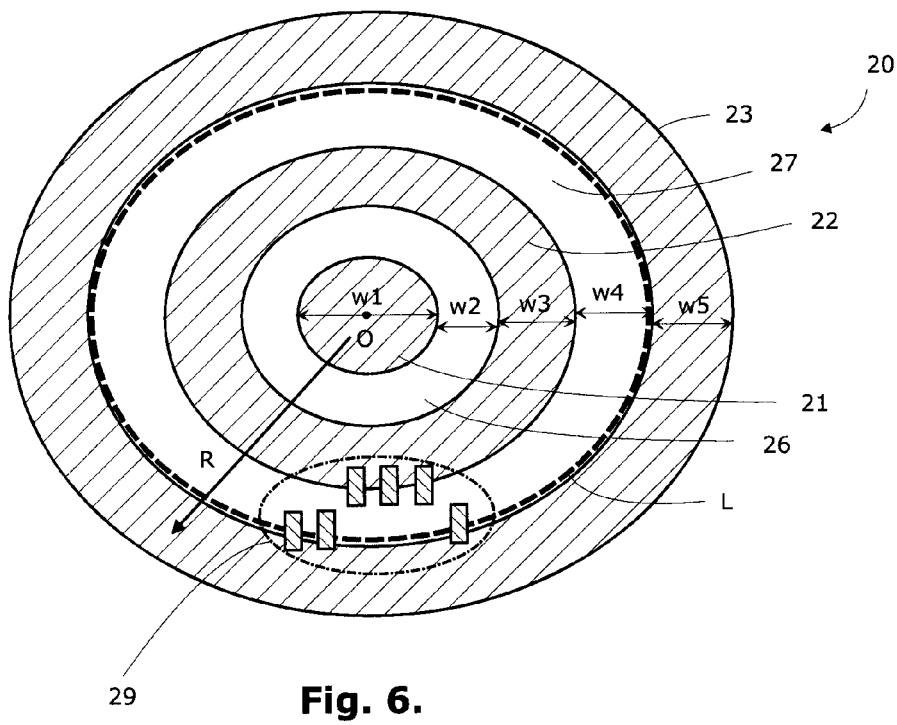
FIG. 6 depicts a touch member comprising a touch surface with sensor electrodes according to some embodiments.

In a touch member 210 according to an embodiment the sensor electrodes 21-23, 31-33 are modified so that, upon touching the touch surface 20, 30, a projected signal level measured from the sensor electrodes 21-23, 31-33 draws appropriate signal level graph distribution that is predetermined as discussed earlier. Capacitance values of the sensor electrodes 21-23, 31-33 in the touch member 210 can be summed up either in a physical level or in a signal level to add implementation variety. In order to modify the sensor electrodes 21-23, 31-33 to correspond the appropriate signal level graph distribution at least two ways of modification is used. The modification takes also into account that the indication of movement of the touch 1 is continuous. With reference to FIG. 6 there is shown that modification of width of the sensor electrodes 21-23, 31-33 and width of the spacings 26, 27 is used to adjust the electric properties to correspond the appropriate signal level graph distribution. First modifying w objects of the sensor electrodes 21-23, 31-33 and the spacings 26, 27 that can be individually modified are referred with w1, w2, w3, w4 and w5 in FIG. 6. Alternatively, second modifying objects I on the interleaved areas between the adjacent sensor electrodes and the spacing between can be used to modify the constellation of the sensor electrodes 21-23, 31-33 to correspond the appropriate signal level graph distribution. The second modifying objects I can be either individual pieces of the electrodes or the spacings or both, and the second modifying objects altogether are referred with the reference 29 in FIG. 6. Also a combination of the first and second modifying objects, i.e. both adjusting the width w1-w5 of the sensor electrodes 21-23, 31-33 and the spacings 26, 27 and using individual pieces of the electrodes and/or the spacings I can be used to modify the constellation of the sensor electrodes 21-23, 31-33 to correspond the appropriate signal level graph distribution. Further the direction R of the sweep (a series of touches) can be built-in by using the first and second modifying objects w and I to correspond to the appropriate signal level distribution graph.

In an electronic device 200 according to an embodiment in which the touch member 210 comprises the first and/or second modifying objects w and/or I in order to correspond to the appropriate signal level distribution graph, the controller block 214 known as such can be used to calculate a function of ($a_n$, $b_n$) that correspond to the appropriate signal level distribution graph. For example, the controller block 214 is arranged to sum up capacitance values associated to the sensor electrodes 21-23, 31-33 in the physical level.

In an electronic device 200 according to an embodiment means for selecting (not shown) is arranged to select a locking operation state for all the touch members of the electronic device if the controller selects the locking operation state for any of the touch members of the electronic device 200. This is useful in cases in which the touch keyboard or touch pad comprises a plurality of touch members 210 and for example a cheek, book or other such flat object covers part of the touch members 210 so that they have got instruction to be in the locking state. Then the means for selecting is arranged to select a locking operation state for all the touch members 210 of the electronic device 200. The means for selecting may comprise means for detecting the locking operation state of adjacent touch members 210 or all touch members 210 of the electronic device 200.

Figure 7:
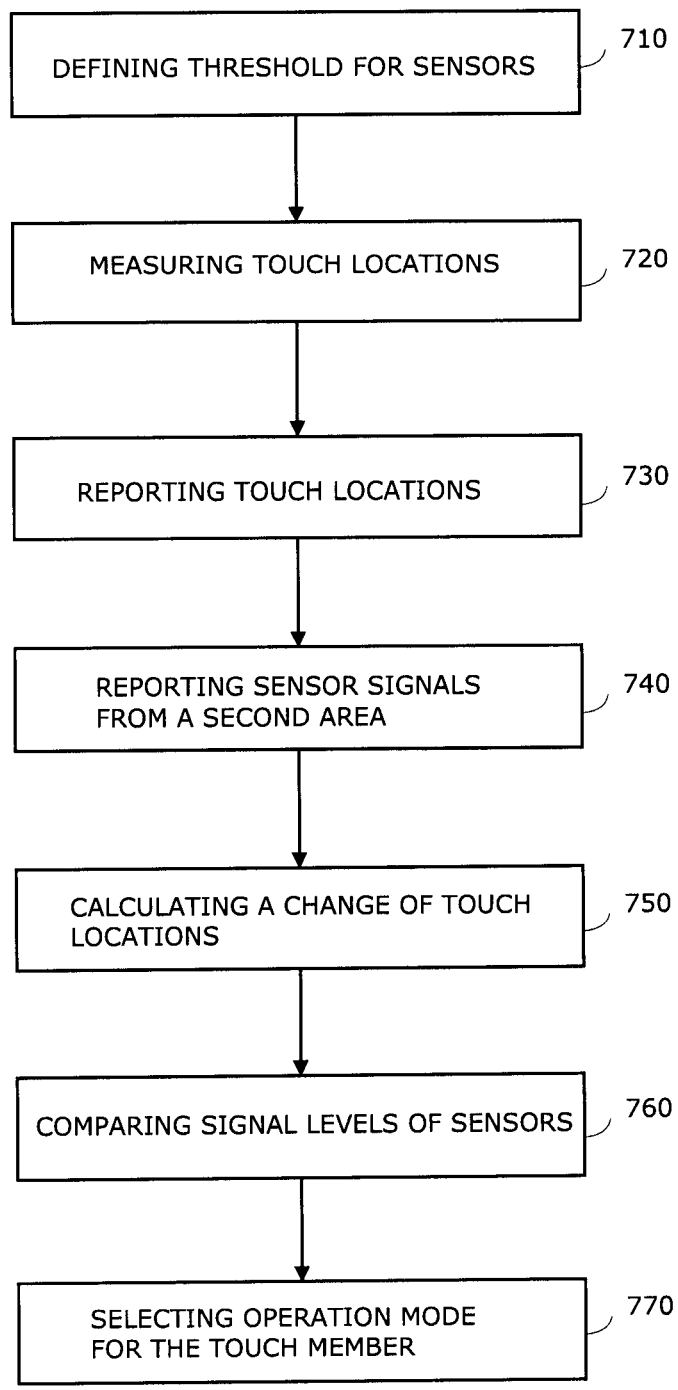
FIG. 7 depicts a flow diagram of a method according to an embodiment.

FIG. 7 as a flow chart of a method according to an embodiment for controlling the touch member 210. It also relates to a method according to an embodiment for controlling the electronic device 200 comprising the touch member 210. Step 710 comprises defining a certain signal level threshold to each of at least two sensor electrodes 21-23, 31-33 separated from each other on a touch surface 20, 30. The signal level threshold relates to activate the sensor electrode 21-23, 31-33 so that the sensor electrode 21-23, 31-33 is established to be ready to operate if the measured sensor signal level is in excess of the signal level threshold. However, in order to activate the touch member 210 to the activated operation mode, before that two adjacent sensor electrodes 21-23, 31-33 have to be established at the same time. Step 720 comprises measuring, upon touching the touch surface in an unlocked state, a signal level from each of the at least two electrodes 21-23, 31-33 to indicate a touch location on the touch surface 210. Then step 730 comprises reporting periodically the touch location with respect to a first area of the touch surface 210. A frequence of reporting can be the same as the frequence of measuring in step 720. However the frequence of reporting may also be different than the frequence of measuring. Reporting may also take place on request of the controller block 214. Step 740 comprises reporting the measured signal level of each of the electrodes 23, 33 in a second area of the touch surface 210. The touch surface 20, 30 is divided into two areas, namely the first area and the second area. Step 750 comprises calculating a change of the touch location based on the reported touch location to produce location information. Step 760 comprises comparing the reported measured signal level to the signal level threshold of the corresponding sensor electrode to produce signal level information. Step 770 comprises selecting an operation state of a touch member 210 based on location information and signal level information.

In a method according to an embodiment the controller block 214 is capable of sending location information and signal level information further.

In a method according to an embodiment the controller block 214 is capable of sending instruction to select an activated operation state if the calculated touch location information indicates that the touch location is within the first area and if the compared signal level information does not reach the signal level threshold of the corresponding electrode.

In a method according to an embodiment the controller block 214 is capable of sending instruction to select a locked operation state (i.e. deactivated operation state) if the calculated touch location information indicates that the touch location is within the second area and if the compared signal level information does not reach the signal level threshold of the corresponding electrode.

In a method according to an embodiment the controller block 214 is capable of sending instruction to select a locked operation state (i.e. deactivated operation state) if the calculated touch location information indicates that the touch location is within the first area and if the compared signal level information reaches the signal level threshold of the corresponding electrode.

In a method according to an embodiment the sensor electrodes 21-23, 31-33 are capable of reporting the touch location based on a distance $a_n$ between the touch location and a reference point O, and a relative size of the touch $b_n$, wherein the reference point O is defined with respect to a constellation of the sensor electrodes 21-23, 31-33, and n relates to a number of periodical reportings.

In a method according to an embodiment a shape of each of the sensor electrodes 21-23, 31-33 can be modified in a way that a sequence of indicated touch locations form a continuous sequence of measured signal levels when the touch location moves in a certain direction R.

In a method according to an embodiment the sensor electrodes 21-23, 31-33 are capable of measuring a sequence of signal levels to correspond to a projected capacitance of the electrodes.

In a method according to an embodiment the electronic device 200 is capable of further selecting the locking operation state for all the touch members 210 of the electronic device 200 if the locking operation state for any of the touch member of the electronic device 200 is selected.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is intention, therefore, to be limited only and indicated by scope of the claims appended hereto.

The invention claimed is:
1. A touch member comprising
a touch surface comprising at least two electrodes that are separated from each other on the touch surface, each of the electrodes having a certain signal level threshold in order to activate the touch member, and
a first area and a second area within the touch surface, wherein the at least two electrodes, upon touching the touch member in an unlocked state, are arranged to measure periodically a signal level received from each of the electrodes to indicate a touch location, report periodically the touch location with respect to the first area of the touch surface, report the measured signal level of each of the electrodes in the second area of the touch surface, and receive instruction to select an operation state of the touch member based on calculated touch location information of the reported touch location and compared signal level information of the reported measured signal level.

2. Touch member according to claim 1, wherein the at least two electrodes are arranged to receive instruction to select an activated operation state if the calculated touch location information indicates that the touch location is within the first area and if the compared signal level information does not reach the signal level threshold of the corresponding electrode.

3. Touch member according to claim 2, wherein, in the beginning of the measurements, the measured signal level of the electrode in the second area does not reach the signal level threshold of the corresponding electrode and said measured signal level does not reach the measured signal level of an adjacent electrode in the first area.

4. Touch member according to claim 1, wherein the at least two electrodes are arranged to receive instruction to select a locked operation state if the calculated touch location information indicates that the touch location is within the second area and if the compared signal level information does not reach the signal level threshold of the corresponding electrode.

5. Touch member according to claim 1, wherein the at least two electrodes are arranged to receive instruction to select a locked operation state if the calculated touch location information indicates that the touch location is within the first area and if the compared signal level information reaches the signal level threshold of the corresponding electrode.

6. Touch member according to claim 5, wherein the measured signal level of each of the at least two electrodes reaches the signal level threshold of the corresponding electrode.

7. Touch member according to claim 5, wherein, in the beginning of the measurements, the measured signal level of the electrode in the second area reaches the signal level threshold of the corresponding electrode, and said measured signal level does not reach the measured signal level of an adjacent electrode in the first area.

8. Touch member according to claim 5, wherein, in the beginning of the measurements, the measured signal level of the electrode in the second area does not reach the measured signal level of an adjacent electrode in the first area.

9. Touch member according to claim 1, comprising electrodes arranged in concentric constellation, wherein a reference point of the constellation is defined.

10. Touch member according to claim 9, wherein the touch location is based on a distance between the reference point and the touch location, and a relative size of the touch.

11. Touch member according to claim 10, wherein the relative size of the touch relates to the measured signal level of each of the electrodes that are touched.

12. Touch member according to claim 1, wherein the signal level threshold for each of the electrodes is defined by modifying a shape of each of the electrodes in a way that a sequence of indicated touch locations form a continuous sequence of measured signal levels when the touch location moves in a certain direction.

13. Touch member according to claim 12, wherein the shape of each of the electrodes with respect to the touch surface is modified by defining a width of each of the electrodes and a width of a spacing between the adjacent electrodes or wherein the shape of each of the electrodes is modified by adding interleaved areas in the electrodes.

14. Touch member according to claim 12, wherein sequence of measured signal levels correspond to a projected capacitance of the electrodes.

15. Touch member according to claim 1, wherein a form factor of each of the electrodes is a full ring or a half ring with respect to the touch surface.

16. An electronic device comprising
at least one touch member having a touch surface comprising at least two electrodes that are separated from each other on the touch surface, each of the electrodes having a certain signal level threshold in order to activate the touch member, and having a first area and a second area within the touch surface,
the at least two electrodes, upon touching the touch member in an unlocked state, are arranged to
measure periodically a signal level received from each of the electrodes to indicate a touch location,
report periodically the touch location with respect to the first area of the touch surface, and
report the measured signal level of each of the electrodes in the second area of the touch surface,
a controller arranged to
calculate a change of the touch location based on the reported touch location to produce location information,
compare the reported measured signal level to the signal level threshold of the corresponding electrode to produce signal level information, and
select an operation state of the touch member based on received location information and signal level information.

17. Electronic device according to claim 16, further comprising a multiplexer arranged to multiplex conductors from each of the electrodes so that an average number of input/output conductors from the touch member is less than a number of the electrodes in the touch member.

18. Electronic device according to claim 16, further comprising a memory arranged to store a set of signal level thresholds for each of the at least two electrodes.

19. Electronic device according to claim 16, further comprising means for selecting the locking operation state for all the touch members of the electronic device if the controller selects the locking operation state for any of the touch member of the electronic device.

20. A method comprising
defining a certain signal level threshold to each of at least two electrodes separated from each other on a touch surface, the signal level threshold relating to activate the electrode,
upon touching the touch surface in an unlocked state, measuring a signal level from each of the at least two electrodes to indicate a touch location on the touch surface,
reporting periodically the touch location with respect to a first area of the touch surface,
reporting the measured signal level of each of the electrodes in a second area of the touch surface that excludes the first area,
calculating a change of the touch location based on the reported touch location to produce location information,
comparing the reported measured signal level to the signal level threshold of the corresponding electrode to produce signal level information, and
selecting an operation state of a touch member based on location information and signal level information.

* * * * *